United States Patent [19]

Asai et al.

[11] 4,327,475
[45] May 4, 1982

[54] METHOD OF MANUFACTURING A FET DEVICE DISPOSED IN A COMPOUND S/C LAYER ON A SEMI-INSULATING SUBSTRATE

[75] Inventors: Kazuyoshi Asai, Iruma; Yasunobu Ishii; Katsuhiko Kurumada, both of Tokyo, all of Japan

[73] Assignee: Nippon Telegraph & Telephone Public Corporation, Tokyo, Japan

[21] Appl. No.: 161,781

[22] Filed: Jun. 23, 1980

[30] Foreign Application Priority Data

Nov. 26, 1979 [JP] Japan ............................. 53/153450

[51] Int. Cl.³ .................... H01L 21/26; H01L 29/78; H01L 29/205; H01L 27/14
[52] U.S. Cl. .................................. 29/571; 29/576 B; 29/578; 148/187; 357/22; 357/61; 357/91
[58] Field of Search ................ 148/1.5, 187; 29/571, 29/576 B, 578; 357/22, 91, 61

[56] References Cited

U.S. PATENT DOCUMENTS

| | | | |
|---|---|---|---|
| 3,836,993 | 9/1974 | Joshi | 357/22 |
| 4,033,788 | 7/1977 | Hunsperger et al. | 148/1.5 |
| 4,257,057 | 3/1981 | Cheung et al. | 357/61 |

OTHER PUBLICATIONS

Lechti, I.E.E.E. Trans., vol. MTT-24, (1976) 279-300.
Welch et al., Joun. Appl. Phys. 45 (1974) 3685.
Hunsperger et al., Solid St. Electronics, 18 (1975) 349.

*Primary Examiner*—Upendra Roy
*Attorney, Agent, or Firm*—Charles E. Pfund

[57] ABSTRACT

A method of manufacturing a field effect transistor uses a semiinsulating substrate consisting of a compound semiconductor, and an N type semiconductor layer formed on the substrate. The method comprises the steps of implanting ions of a P type impurity from the main surface of said semiconductor layer to form at least two P type gate regions which extend from the main surface to substantially reach said substrate and are disposed with a predetermined interval, and sintering metallic layers on the gate regions in ohmic contact and on opposite sides of the semiconductor layers with said semiconductor gate regions being interposed therebetween to form a gate, a source and a drain electrodes. Said implantation step further comprises a step of positioning at least two of said gate regions such that said gate regions come in contact with the boundary region of the transistor to be constructed.

The method of manufacturing the field effect transistor is useful for fabricating the field effect transistor at a high yield which is suitable to assemble an integrated circuit.

6 Claims, 17 Drawing Figures

METHOD OF MANUFACTURING A FET DEVICE DISPOSED IN A COMPOUND S/C LAYER ON A SEMI-INSULATING SUBSTRATE

BACKGROUND OF THE INVENTION

This invention relates to a method of manufacturing a field effect transistor, more particularly a method of manufacturing a field effect transistor device in which junction regions which constitute the field effect transistor are disposed in a compound semiconductor layer on a semiinsulating substrate made of a similar compound semiconductor.

An ordinary field effect transistor now being used widely is constructed such that an N type semiconductor layer made of such compound semiconductor as GaAs is epitaxially grown on a semiinsulating substrate made of the similar compound semiconductor; that a source electrode and a drain electrode having a predetermined spacing are attached to the surface of the semiconductor layer with ohmic contacts and that a gate electrode in a Schottky junction with the semiconductor layer is disposed between the source and drain electrodes. Such a construction is disclosed in a Charles A. Liechti's paper entitled "Microwave Field-Effect Transistor—1976", I.E.E.E. Transaction on Microwave Theory and Techniques, Vol. MTT-24, No. 6 pages 279–300, June, 1976.

In a transistor of this construction, a depletion layer extends into the semiconductor layer from the Schottky junction according to the magnitude of a control voltage impressed across the gate and source electrodes so that the cross-sectional area of a drain current path in the semiconductor layer is narrowed in accordance with the gate control voltage.

Moreover, the transistor constructed as above described involves the following problems.

Firstly, as the semiconductor layer is epitaxially grown on the semiinsulating substrate, in most cases, portions of the semiconductor layer near the substrate have crystal defects. In addition, since these portions are formed at the initial stage of epitaxial growth, the impurity concentration is difficult to make uniform due to manufacturing technique. For this reason it is extremely difficult to make uniform the characteristics of the transistor at or near cutting off the drain current (gate pinch off) regardless of an accurate control of the thickness of the semiconductor layer in the subsequent process for manufacturing steps of the transistor. Thus, this problem is one of the factors that decreases the yield of satisfactory transistors. This is more particularly true in transistors assembled into an integrated circuit. For example, it is desired to ON/OFF control the drain current with relatively small gate control voltage of about ±1 volt, in which case the thickness of the semiconductor layer becomes about 0.1 to 0.15 micron for $1 \times 10^{17}$ to $5 \times 10^{16}$ cm$^{-3}$ of N type impurity concentration in GaAs so that the problem caused by the construction described above results in a large dispersion in the gate pinch off voltage.

For this reason, it is difficult to assemble transistors into an integrated circuit for commercial use.

Furthermore, the transistor of this type is manufactured by the steps of forming a semiconductive layer of one conductivity type by implanting ions of an impurity into one surface of a semiinsulating substrate made of such compound as GaAs, forming source and drain electrodes in an ohmic contact with the surface of the substrate, and then forming a gate electrode to form a Schottky junction. Transistors prepared by this method are disclosed in a B. M. Welch et al. paper entitled "Gallium Arsenide Field-Effect Transistors by Ion Implantation", Journal of Applied Physics, Vol. 45, No. 8, pages 3685–3687, August 1974 and a R. G. Hunsperger et al. paper entitled "Ion-Implanted Microwave Field Effect Transistors in GaAs", Solid State Electronics, Vol. 18, pages 349–353.

With the transistor of the construction described above, for the purpose of recovering distorted crystal structure caused by the implanted ions which are implanted into the semiconductor substrate for forming the semiconductor layer and of electrically activating the implanted ions of an impurity it is necessary to subject the implanted substrate to an annealing treatment in which the substrate is heated to a high temperature of 800° to 900° C. However, such annealing treatment encounters the following problem. More particularly, such residual impurities as chromium, silicon, etc. contained in the substrate at the time of preparing the semiinsulating semiconductor substrate tend to diffuse or unwanted external impurities might be incorporated, or impurities implanted into a predetermined portion at a predetermined concentration tend to diffuse. In addition, when the surface of the semiinsulating semiconductor substrate is subjected to the high temperature described above, such surface of compound semiconductor as GaAs often decomposes. Due to various phenomena appearing at the time of annealing it is difficult to obtain at a high reproducibility a semiconductor having a uniform thickness and containing an impurity at a uniform concentration. This also causes dispersion in the pinch off voltage of the resulting transistor thus decreasing the yield.

SUMMARY OF THE INVENTION

Accordingly, it is a principal object of this invention to provide a method of manufacturing a field effect transistor at a high yield which is suitable for manufacturing an integrated circuit.

Another object of this invention is to provide a method of manufacturing a field effect transistor capable of reducing dispersion in the gate pinch off voltage.

A further object of this invention is to provide a method of manufacturing a field effect transistor capable of determining the size of a channel to be formed according to the accuracy of a mask utilized at the time of manufacturing the transistor and having a uniform characteristic and which can be manufactured at a higher yield than the prior art field effect transistors.

A still further object of this invention is to provide a method of manufacturing a field effect transistor capable of having excellent characteristics not affected by the crystal quality of a compound semiconductor layer formed by growing on a semiinsulating compound semiconductor substrate.

Yet another object of this invention is to provide a method of manufacturing a field effect transistor device having characteristic not affected by various factors caused by a high temperature annealing treatment utilized at a time when an N type semiconductor layer is formed in a semiinsulating substrate by N type ion implantation technique.

According to this invention, these and other objects can be accomplished by providing a method of manufacturing a field effect transistor comprising the steps of forming a semiinsulating layer made of a compound semiconductor and a first conductivity type compound semiconductor layer which is disposed on said semiinsulating layer, implanting ions of an impurity from the main surface of said compound semiconductor layer to form at least two semiconductor gate regions which extend from the main surface to substantially reach said semiinsulating layer and are disposed with a predetermined interval, said impurity being different from the first conductivity type, and the second conductivity type being different from the first conductivity type, and sintering metallic layers on the semiconductor gate region in ohmic contact and on opposite sides of the semiconductor layers with said semiconductor gate regions being interposed therebetween to form a gate, a source and a drain electrodes, said second step further comprising a step of positioning at least two of said semiconductor gate regions such that said gate regions come in contact with the periphery region of the transistor to be constructed.

DESCRIPTION OF THE PREFERRED EMBODIMENTS

Figure 1:
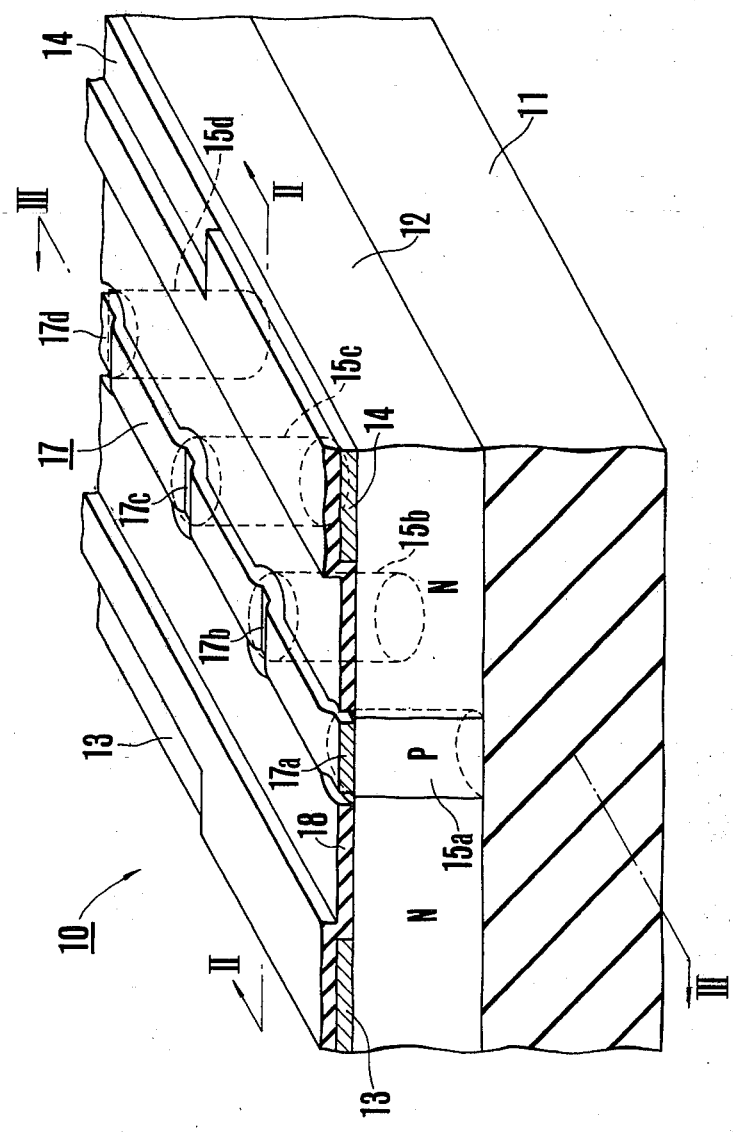
FIG. 1 is a perspective view showing one embodiment of a field effect transistor device embodying the invention.

A preferred embodiment of the field effect transistor 10 shown in FIG. 1 comprises a semiconductor substrate 11 made of such compounds as GaAs, or InP. The substrate 11 has a thickness of about 200 to 400 microns and a high specific resistivity of $10^6$ or more ohm-centimeter. On the substrate 11 is formed an N type similar compound semiconductor layer 12, for example made of GaAs by epitaxial growth technique. The semiconductor layer 12 has an N type impurity concentration of $5 \times 10^{16}$ atoms/cm$^3$, for example, and a thickness of 0.1 to 1 micron. Layer 13 and 14 of such metals as gold-tin and gold-germanium are applied in parallel on the main surface of the semiconductor layer 12 with a suitable spacing, for example 5 to 10 microns, to form source and drain electrodes, and these metal layers are in an ohmic contact with the semiconductor layer 12.

A plurality of P type semiconductor gate regions 15a to 15d are formed in the semiconductor layer 12 along a straight line at about the center between the metal layers 13 and 14 and extending in parallel therewith. These semiconductor gate regions 15a to 15d are formed by implanting ions of Be, for example, into the semiconductor layer 12 and have a circular cross-sectional configuration and reach to the interface between the semiconductor layer 12 and the semiinsulating substrate 11 or extend beyond the interface into the substrate 11. Temperature of the annealing treatment after the above described Be implantation to recover the crystal structure damaged by the implantation and to electrically activate Be ions to P type impurities is in a range extremely low, for example 500° to 600° C., comparing to the annealing temperature for N type impurity implantation. Therefore unwanted phenomena introduced during the high tmmperature annealing treatment after N type impurity implantation is annihilated in case of Be implantation for P type case. The portions of these gate regions exposed on the semiconductor layer 12 are connected by ohmic contact to a metal layer 17 made of gold-zinc and acting as a gate electrode. The metal layer 17 is covered by such insulating layer 18 as $SiO_2$ and separated from the main surface of the semiconductor layer 12 except those portions 17a to 17d in contact with the gate regions 15a to 15d respectively. In the example shown, the insulating layer 18 covers the exposed surface of the semiconductor layer 12 and the metal layers 13 and 14.

Figure 2:
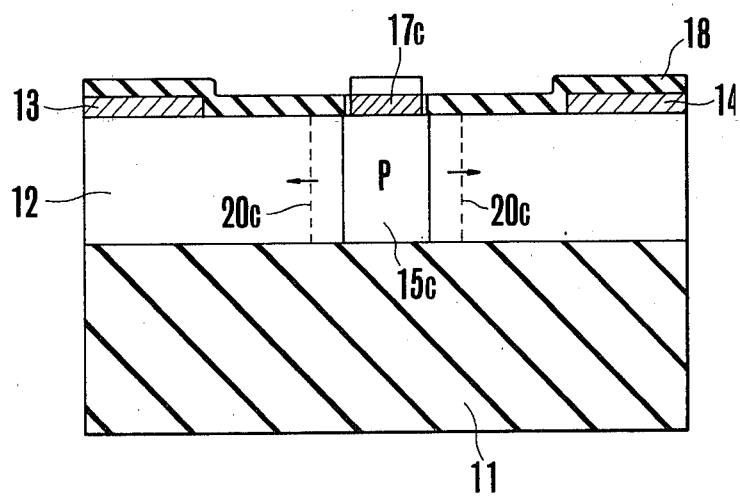
FIG. 2 is a cross-sectional view taken along a line II—II shown in FIG. 1.
Figure 3:
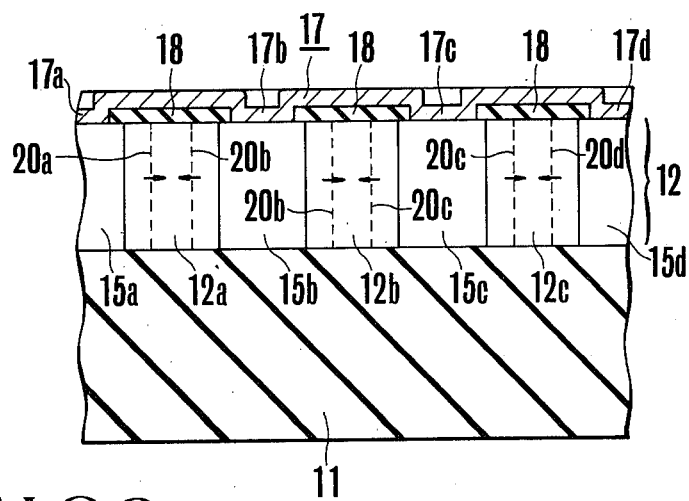
FIG. 3 is a longitudinal sectional view taken along a line III—III shown in FIG. 1.

This transistor operates as follows. Thus, when a predetermined bias source (not shown) is connected between the source electrode 13 and the drain electrode 14, drain current would flow through a path tracing through drain electrode 14—semiconductor layer 12—portions thereof between respective semiconductor gate regions—semiconductor layer 12—source electrode 13. Under these conditions, when a control voltage is impressed across the gate electrodes 17a to 17d and the source electrode 13 such that the PN junctions formed between the semiconductor layer 12 and respective gate regions would be biased reversely, depletion layers 20a, 20b, 20c and 20d (shown by dotted lines in FIGS. 2 and 3 would extend toward the semiconductor layer 12 from respective semiconductor gate regions 15a to 15d as shown by arrow in FIGS. 2 and 3. As a consequence, in regions 12a to 12c (See FIG. 3) of the semiconductor layer 12 through which the drain current flows between respective semiconductor gate regions 15a to 15d depletion layers extend from the semiconductor gate regions 15a and 15b, 15b and 15c, and 15c and 15d to adjacent respective regions 12a to 12c thus decreasing the width of these regions according to the reversely applied gate voltage. Accordingly, the drain current flowing through these regions decreases gradually with the increase in the reversing biased gate control voltage, and is finally cut off.

The field effect transistor constructed as above described has the following advantages.

Figure 3A:
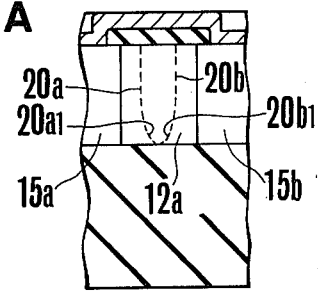
FIG. 3A is a detailed sectional view showing a manner of extending of a depletion layer shown in FIG. 3.

(1) Since a plurality of semiconductor gate regions are formed through a semiconductor layer consisting of a compound semiconductor formed on a semiinsulating semiconductor layer made of similar compound from the main surface of the semiconductor layer to the semiinsulating semiconductor it is possible to obtain field effect transistors of uniform quality at a high yield, which are suitable to fabricate integrated circuits. More particularly, the depletion layers extending from the semiconductor gate regions formed substantially at right angles to the semiconductor layer 12 are formed substantially in parallel with the direction of thickness of the semiconductor layer and extend toward the opposed semiconductor gate regions. For example, the state of the depletion layer will be described in more detail with reference to FIG. 3A. The depletion layer is more or less deformed at a portion of the semiconductor layer 12a close to the substrate due to crystal defects or nonuniform concentration of the impurity, and under a normal state the depletion layer extends longer than other portions because of the less concentration of N type impurities. For this reason, these portions $20_{a1}$ and $20_{b1}$ are connected together a little earlier than other portions. These portions are located near the substrate within a few hundred Angstroms which is much smaller than the thickness (1 micron, for example) of the semiconductor layer 12. For this reason, regardless of a variation in the characteristics of these portions $20_{a1}$ and $20_{b1}$, the control of the drain current, that is the gate characteristic, is determined by the state of elongation of relatively uniform depletion layers at portions other than the portions $20_{a1}$ and $20_{b1}$. Thus, it is possible to obtain transistors having uniform characteristics. Furthermore, according to this invention since the depletion layers extend in the opposite directions, even when the thickness of the semiconductor layer is reduced to several hundred Angstroms, for example, for the purpose of obtaining logic transistors of a low power consumption, the gate pinch off characteristics of the transistors are not affected by the crystal defects or nonuniform concentration of the impurity in the direction of thickness. Thus, it is possible to obtain field effect transistors consuming less power than the prior art transistors.

(2) Furthermore, as it is possible to determine the width of the channel according to the space between the semiconductor gate regions, the gate control characteristic of the transistor can be determined by the accuracy of a mask utilized to form the gate regions. Moreover, as the thickness of the semiconductor layer is not predetermined for the purpose of determining the width of the channel as has been the prior art practice, it is possible to select any desired thickness for the semiconductor layer thus readily producing a field effect transistor of a desired current value.

(3) In addition, according to this invention, the semiconductor gate regions at both ends of an array of the gate regions are positioned at peripheries or boundary regions of the transistor region, so that it is possible to obtain a transistor that would not be influenced by the construction at the periphery of the transistor region.

(4) As above described since the semiconductor gate regions at both ends of the array thereof are positioned at the peripheries of the transistor region, it is possible to prevent the gate control characteristic from being affected by the side walls formed when the transistor is formed as a mesa type.

(5) In addition, by positioning the semiconductor gate regions at the peripheries of the transistor region, even when the accuracy of positioning a mask utilized to form the peripheries of the transistor may decrease more or less, it is possible to obtain at a high yield transistors having desired characteristics. This advantage can be enhanced by increasing the dimension of the semiconductor gate regions in contact with the periphery in the direction of alignment of the gate regions.

The field effect transistor having a construction described above can be prepared by using steps shown in FIGS. 4A through 4J.

Figure 4A:
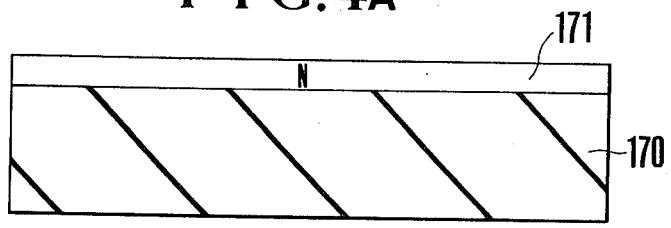
FIGS. 4A through 4J show successive steps of another method of manufacturing transistor according to the invention.

First, there is prepared a semiinsulating substrate 170 which is made of a compound semiconductor such as GaAs and has the resistivity more than $10^6$ ohm.cm and thickness of from 200 to 400 microns. Then, there is formed on the surface of said substrate 170, an N type semiconductor layer 171 which is made of a compound such as GaAs having the thickness of from 0.1 to 1 micron. The semiconductor layer 171 may be, for instance, epitaxially grown. This state is shown in FIG. 4A.

Figure 4B:
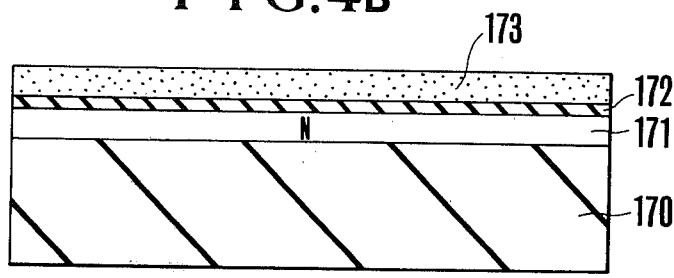

An insulating protective layer 172 made of $SiO_2$, $Si_3N_4$ etc., having the thickness of between 0.05 and 0.5 microns is formed on top of the N type semiconductor layer 171. The protective layer is formed by the conventional method such as CVD (chemical vapor deposition) or sputtering technique. A photoresist layer 173 is subsequently formed on the protective layer 172 in a thickness of between 0.5 and 3 microns. This state is illustrated in FIG. 4B.

Figure 4C:
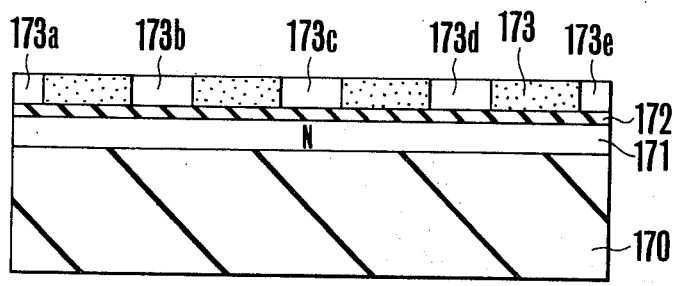

The photoresist layer 173 is then provided, in alignment, with a plurality of windows or holes 173a through 173e by photoetching technique. The holes in this case are shaped rectangular and are spaced at a regular interval with one another. This state is illustrated in FIG. 4C.

Figure 4D:
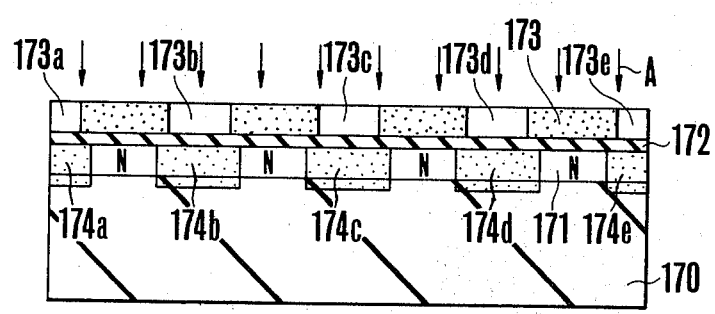

Utilizing the photoresist layer 173 provided with the holes as a mask, ions of impurity such as Be are implanted from above in a direction indicated by the arrow A, under conditions of, for example, 100 KeV and a dose of Be ions in an amount of $5 \times 10^{14}$ cm$^{-2}$. Be ions thus implanted via the holes 173a through 173e of the photoresist layer 173 would penetrate the protective layer 172 as well as the semiconductor layer 171 and reach as far as the upper portion of the semiinsulating substrate 170 adjacent thereto, which results in Be ion implanted regions 174a through 174e formed at portions corresponding to said holes 173a through 173e. This state is shown in FIG. 4D.

Figure 4E:
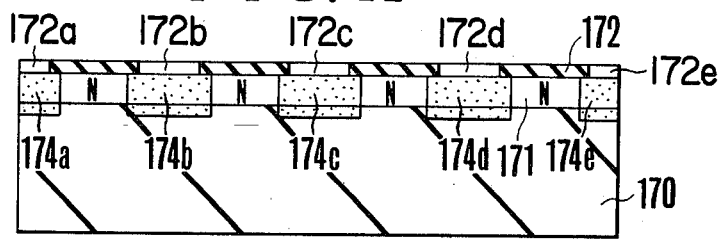

The portions of the protective layer 172 which are exposed in the holes 173a through 173e will then be removed by utilizing the photoresist layer 173 as a mask. This is carried out, for example, by employing the conventional sputtering or plasma etching technique. The photoresist layer 173 is then etched off with the use of, for example, resist remover and the like. This state is shown in FIG. 4E.

Figure 4F:
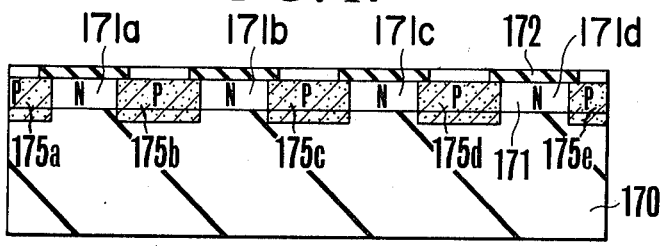

It is then subjected to an annealing treatment at a low temperature of, for example, between 500° C. and 600° C. for 20 to 60 minutes. Since the annealing treatment for the electrical activation of P type impurity is conducted at a low temperature, there will hardly be any effects caused by the high temperature annealing for the N type impurity mentioned above. The ion implanted regions 174a through 174e are thus activated, thereby restoring crystals of the semiconductor from damage caused by the ion implanting and rendering the regions 174a through 174e to be the P type semiconductor gate regions 175a through 175e. As a result, a PN junction is formed between the P type semiconductor gate regions 175a through 175e and the remaining N type semiconductor regions 171a through 171d within the semiconductor region 171. This state is illustrated in FIG. 4F.

Figure 4G:
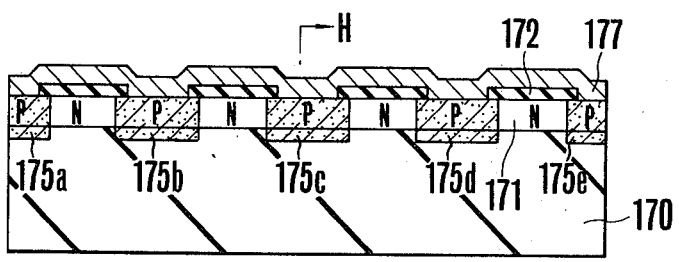

A strip of metallic layer 177 having the thickness of between 0.1 and 1 micron is formed to connect the semiconductor gate regions 175a through 175e which are disposed in alignment, using the holes 172a through 172e of the protective layer 172 as a mask. The metallic layer 177 is formed either by vapor desposition or sputtering technique, and is in ohmic contact with the semiconductor gate regions 175a through 175e to function as the gate electrode. In this case, the metallic layer 177 is formed, for example, by AuZn alloy. This state is shown in FIG. 4G.

Figure 4H:
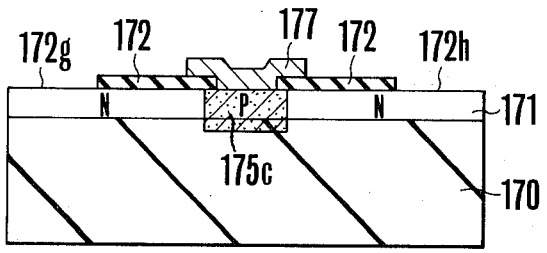

The protective layers 172 on both sides of the strip of metallic layer 177 are then removed by etching according to a predetermined pattern to form striped grooves 172g and 172h that are in parallel with said semiconductor gate regions 175a through 175e. This state is shown in FIG. 4H. FIG. 4H shows the portion indicated by the line H—H of FIG. 4G in cross section.

Figure 4I:
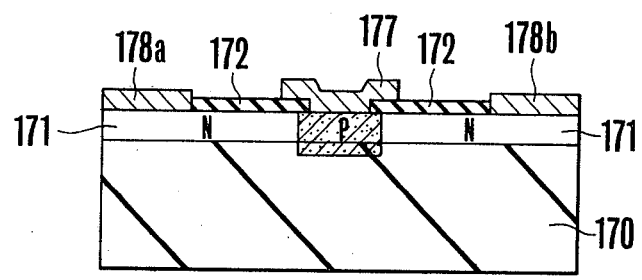

Conductive layers 178a and 178b in the form of a stripe are then formed to come in ohmic contact with the semiconductor layer 171 that is exposed in said grooves 172g and 172h. The conductor layers are made of AuGe alloy and function as the source and drain electrodes of the field effect transistor to be constructed. This state is shown in FIG. 4I.

Figure 4J:
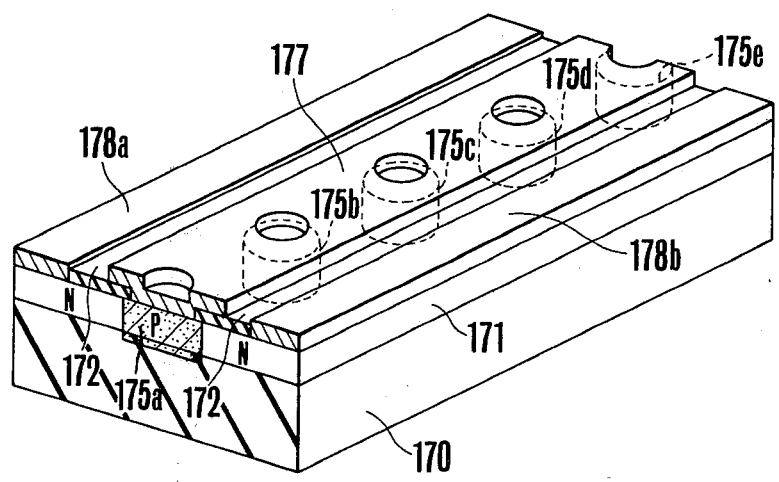

The configuration of the field effect transistor thus obtained is illustrated in FIG. 4J.

The field effect transistor thus obtained and shown in FIG. 4J had the saturation current $I_{SD}$ of 86 mA where the voltage applied to the gate electrode was zero, the mutual conductance was 20 mS which is expressed by the changes per 1 volt in $I_{SD}$ of the voltage $V_{SD}$ between the source and drain electrodes, and the pinch-off voltage was −9 V which renders the value of $I_{SD}$ zero.

Figure 5:
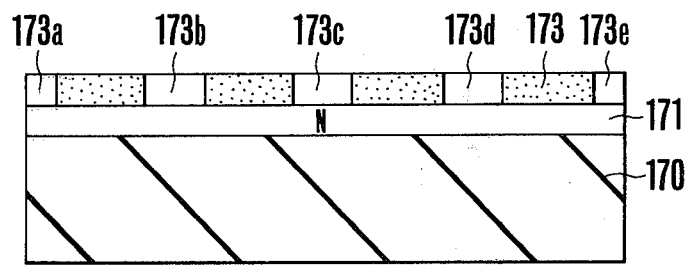
FIGS. 5, 6A and 6B show modifications of the manufacturing method shown in FIG. 4.

FIG. 5 shows a modification of the method shown in FIG. 4. The sectional structure of FIG. 5 corresponds to the one shown in FIG. 4C. As can be understood from the figure, the semiconductor layer 171 is exposed in the holes 173a through 173e formed in an alignment on the photoresist layer 173; this is because the photoresist layer 173 is formed directly on the semiconductor layer 171 without the previous protective layer 172. When ions are implanted in this state, the acceleration voltage at the time of ion implanting can be reduced as compared with the method in FIG. 4. It is further noted that the photoresist layer 173 will function to insulate and isolate spatially the N type semiconductor layers at the time of depositing the gate electrode and then be removed thereafter by etching. It is removed because the photoresist will not withstand a high temperature treatment.

Figure 6A:
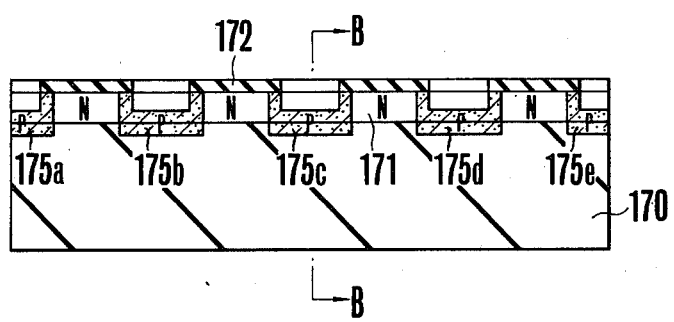
Figure 6B:
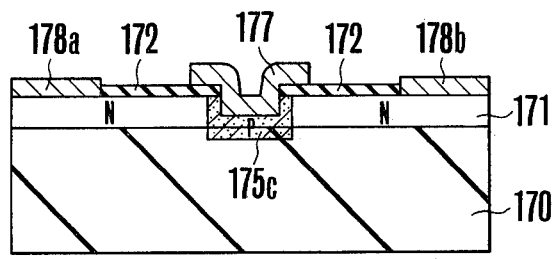

FIGS. 6A and 6B show still another modifications of the example shown in FIG. 4. First, the process successive to that of FIG. 4F is shown in FIG. 6A wherein the portion of P type semiconductor gate regions 175a through 175e near its surface are removed in a thickness of between 0.1 and 0.5 microns, for example, by etching using the photoresist layer 173 or the protective layer 172 as a mask. In this case, the P type semiconductor gate regions 175a through 175e are somewhat expanded in the direction of the lower surface of the protective layer 172 extending from the edge of the hole of the protective layer 172 due to ion implanting and annealing processes subsequent to the process in FIG. 4E. Therefore, the P type semiconductor gate regions will be shaped in the letter U in cross section by the etching treatment described above and the semiconductor layer 171 will not be exposed. The strip of metallic layer will then be disposed on the said semiconductor gate regions by a process similar to that shown in FIG. 4G to form a gate electrode 177 in ohmic contact with said regions and further subjected to the process shown in FIG. 4H. The protective layers 172 located on opposite sides with the semiconductor gate regions 175a through 175e interposed therebetween are removed. After the protective layers 172 are removed during the process of FIG. 4H, the metallic layers 178a and 178b are disposed on the exposed portions of semiconductor 171, to form the source and gate electrodes in ohmic contact with the semiconductor layer 171.

The field effect transistor thus constructed is shown in FIG. 6B, which is a sectional view of the one in FIG. 6A along the line B—B. It is therefore possible to expose the portions of the semiconductor gate regions formed by the ion implanting technique where the P type impurity has the highest concentration, thereby enabling a lower ohmic contact of the regions with the gate electrodes 177 which is to be disposed thereon.

The method for manufacturing a field effect transistor illustrated in FIG. 4 can be modified in various other ways. For example, after or during the steps shown in FIG. 4C, the protective layer can be removed according to the pattern of the windows of the resist, and further subjected to the implanting step of FIG. 4D. It is also possible to have the concentration near the main surface of the semiconductor layer to be the highest by multiple implantation. In this way it will no longer be necessary to remove the surface of the P type semiconductor regions by etching as shown in FIG. 6. Further, although ions of the impurity were implanted on the entire surface of the semiinsulating substrate to form the compound semiconductor layer as shown in FIG. 4A, the ions may be implanted only on a portion of the surface of the substrate.

What is claimed is:

1. A method of manufacturing a field effect transistor comprising the steps of
    a first step of forming a semiinsulating layer made of a compound semiconductor and a compound semiconductor layer which is disposed on said semiinsulating layer;
    a second step of implanting ions of an impurity from the main surface of said compound semiconductor layer to form at least two semiconductor gate regions which extend from the main surface to substantially reach said semiinsulating layer and are disposed with a predetermined interval, said impurity being different from the first conductivity type; and
    a third step of sintering metallic layers on the semiconductor gate region in ohmic contact and on opposite sides of the semiconductor layers with said semiconductor gate regions being interposed therebetween to form a gate, a source and a drain electrodes;
    said second step further comprising a step of positioning at least two of said semiconductor gate regions such that said gate regions come in contact with the periphery region of the transistor to be constructed.

2. The method according to claim 1 wherein the compound semiconductor layer of the first conductivity type is epitaxially grown on the semiinsulating substrate of a semiconductor.

3. The method according to claim 1 wherein said first step includes the step of implanting ions of an impurity of the first conductivity type on at least a portion of the surface of the semiinsulating substrate made of a semiconductor, thereby forming a semiinsulating layer and a semiconductor layer disposed thereon.

4. The method according to claims 1, 2 or 3, wherein said second step includes the steps of
    forming an insulating layer on said semiconductor layer;
    forming on said insulating layer a protective layer made of a material different from that of said insulating layer;
    forming windows on the protective layer at portions which correspond to the portion where the semiconductor gate regions of the protective layer are to be formed;

implanting ions of an impurity of second conductivity type to form a region of the second conductivity type impurity extending from the main surface of the semiconductor layer which corresponds to said windows and reaching the semiinsulating layer with the use of said protective layer as a mask;

removing said protective layer; and forming said region of the second conductivity type impurity into a semiconductor gate regions by subjecting to a heat treatment.

5. The method according to claims 1, 2, or 3 wherein the second step includes the steps of forming a protective layer on said semiconductor layer;

forming windows at positions on the protective layer which correspond to where the semiconductor gate regions thereof are to be formed;

implanting ions of an impurity of second type to form a region of the second conductivity impurity which extends from the main surface of the semiconductor layer corresponding to said windows and reaching the semiinsulating layer, with the use of the protective layer as a mask;

forming the region of the second conductivity impurity into a semiconductor gate region; and said third step includes the step of removing the protective layer.

6. The method according to claims 1, 2 or 3 wherein said second step includes;

forming an insulating layer on said semiconductor layer;

forming on said insulating layer a protective layer made of a material different from that of said insulating layer;

forming windows on the protective layer at portions corresponding to where the semiconductor gate regions are to be formed;

implanting ions of an impurity of second conductivity type, with the use of the protective layer as a mask, to form a region which extends from the main surface of the semiconductor layer corresponding to said window and reaching the semiinsulating layer;

forming windows on said insulating layer with said protective layer being used as a mask;

removing the semiconductor layer which is exposed to a predetermined depth;

removing said protective layer; and forming said region of second conductivity into a semiconductor gate region by subjecting to a heat treatment.

* * * * *